US010863648B2

(12) United States Patent
Zhang et al.

(10) Patent No.: US 10,863,648 B2
(45) Date of Patent: Dec. 8, 2020

(54) MODULAR FAN CHASSIS AIR FILTERING SYSTEM

(71) Applicant: Dell Products L.P., Round Rock, TX (US)

(72) Inventors: Joanne Cuijuan Zhang, San Jose, CA (US); Thuy Thanh Thi Vu, San Jose, CA (US)

(73) Assignee: Dell Products L.P., Round Rock, TX (US)

( * ) Notice: Subject to any disclaimer, the term of this patent is extended or adjusted under 35 U.S.C. 154(b) by 304 days.

(21) Appl. No.: 15/258,687

(22) Filed: Sep. 7, 2016

(65) Prior Publication Data

US 2018/0070473 A1 Mar. 8, 2018

(51) Int. Cl.

| | |
|---|---|
| ***G06F 1/20*** | (2006.01) |
| ***H05K 7/20*** | (2006.01) |
| ***G06F 1/18*** | (2006.01) |
| *F04D 25/16* | (2006.01) |
| *F04D 19/00* | (2006.01) |

(52) U.S. Cl.

CPC ......... *H05K 7/20181* (2013.01); *G06F 1/181* (2013.01); *G06F 1/20* (2013.01); *B01D 2279/45* (2013.01); *F04D 19/007* (2013.01); *F04D 25/166* (2013.01)

(58) Field of Classification Search

CPC ........... H05K 7/20172; H05K 7/20181; H05K 7/20718–20736; H05K 7/20554–20572; H05K 7/20136; G06F 1/20

USPC .......................................................... 361/695

See application file for complete search history.

(56) References Cited

U.S. PATENT DOCUMENTS 4,750,924 A * 6/1988 Potter .................... B01D 46/24 55/472
5,514,036 A * 5/1996 Lin .................... G11B 33/1446 361/695
5,673,029 A * 9/1997 Behl ......................... G06F 1/20 340/584
5,913,926 A * 6/1999 Anderson ............... G06F 1/184 360/98.01
6,185,097 B1 * 2/2001 Behl ......................... G06F 1/20 361/695
6,246,580 B1 * 6/2001 Weng ........................ G06F 1/18 174/16.1
6,319,116 B1 * 11/2001 Behl ...................... G11B 33/02 361/753
6,570,770 B1 * 5/2003 Ross ...................... H05K 5/023 174/51

(Continued)

*Primary Examiner* — Charles G Freay
*Assistant Examiner* — Thomas Fink
(74) *Attorney, Agent, or Firm* — Haynes and Boone, LLP

(57) ABSTRACT

A modular fan chassis air filtering system includes a base that defines a fan device housing that houses a fan device. At least one system chassis coupling feature is included on the base and couples to a system chassis via a modular fan chassis housing defined by the system chassis. An air inlet is defined by the base and allows air to enter the fan device housing in response to operation of the fan device. An air outlet is defined by the base and allows air to exit the fan device housing in response to operation of the fan device. An air filter housing is defined by the base, located between the air inlet and the air outlet, and houses an air filter that filters the air that enters the fan device housing through the air inlet before that air exits the fan device housing through the air outlet.

6 Claims, 12 Drawing Sheets

(56) References Cited

U.S. PATENT DOCUMENTS 7,021,895 B2 * 4/2006 Rubenstein ........... F04D 25/166 415/207
7,033,206 B2 * 4/2006 Chang ................ H05K 7/20172 439/485
7,254,020 B2 * 8/2007 Lee .................... H05K 7/20172 165/122
7,323,027 B1 * 1/2008 Fu ...................... B01D 46/0005 55/385.6
7,499,275 B2 * 3/2009 Lai ..................... H05K 7/20181 361/690
7,515,413 B1 * 4/2009 Curtis ....................... G06F 1/20 165/104.33
7,589,964 B2 * 9/2009 Li ...................... H05K 7/20909 361/694
8,089,763 B2 * 1/2012 Lin .................... H05K 7/20736 361/690
8,385,064 B1 * 2/2013 Smith ................ H05K 7/20727 361/679.48
8,717,764 B2 * 5/2014 Sun .................... H05K 7/20172 165/104.33
8,897,008 B2 * 11/2014 Terwilliger ............... G06F 1/20 165/104.33
9,253,927 B1 * 2/2016 Kull ................... H05K 7/20581
9,451,721 B1 * 9/2016 Shih ........................ G06F 1/263
9,769,958 B2 * 9/2017 Jaskela .............. H05K 7/20718
2001/0024357 A1 * 9/2001 Behl ......................... G06F 1/20 361/679.37
2003/0123222 A1 * 7/2003 Thompson ......... H05K 7/20581 361/679.48
2004/0081596 A1 * 4/2004 Hsi ......................... A61L 9/205 422/186.3
2004/0256334 A1 * 12/2004 Chen .................. H05K 7/20727 211/41.17
2005/0088817 A1 * 4/2005 Ou Yang ............ H05K 7/20181 361/695
2005/0248920 A1 * 11/2005 Huang .................. F04D 29/703 361/696
2007/0081888 A1 * 4/2007 Harrison ............... F04D 19/007 415/47
2007/0283672 A1 * 12/2007 Fu ...................... B01D 46/0005 55/385.6
2008/0266791 A1 * 10/2008 Li ....................... G06F 11/2015 361/695
2008/0304234 A1 * 12/2008 Franz ................. H05K 7/20172 361/695
2008/0310967 A1 * 12/2008 Franz .................... F04D 27/004 417/32
2009/0139405 A1 * 6/2009 Schwarz .............. B01D 39/163 96/17
2010/0017151 A1 * 1/2010 Kerrigan ............ B01D 46/0086 702/47
2011/0127833 A1 * 6/2011 Wu ........................... G06F 1/26 307/31
2012/0194350 A1 * 8/2012 Crisp ........................ G06F 1/26 340/815.42
2013/0127311 A1 * 5/2013 Chiu ......................... G06F 1/20 312/236
2015/0373875 A1 * 12/2015 Kira ................... H05K 7/20181 96/407
2017/0277232 A1 * 9/2017 Yamashita ......... G05D 23/1917

* cited by examiner

MODULAR FAN CHASSIS AIR FILTERING SYSTEM

BACKGROUND

The present disclosure relates generally to information handling systems, and more particularly to a modular fan chassis air filtering system for use with information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, telecommunication devices, utilize fan systems that require air filtering. For example, the Network Equipment-Building Systems (NEBS) is a set of safety, spatial, and environmental design guidelines that are applied to telecommunications devices in the United States, and many telecommunications providers require telecommunication devices to satisfy some level of NEBS certifications. NEBS Level 3 certified telecommunications devices must include air filtering subsystems in their fan systems. However, the provisioning of air filtering subsystems raises some issues.

For example, FIG. 2A illustrates a prior art telecommunications device 200 that includes a device chassis 202 having a 1 rack unit (1 RU) height and that is illustrated as housing a plurality of module fan chassis 204. Each modular fan chassis 204 may be provided by a separate sheet metal housing that houses a fan device and that is configured to be inserted in and removed from a fan housing defined by the device chassis 202 (e.g., using the handles 204*a*). Each modular fan chassis may also include other features such as, for example, light emitting devices (LEDs) that are visible on a front wall of the module fan chassis 204 (e.g., the front wall from which the handles 204*a* extend from) and that are configured to indicate a status of the fan device or other subsystem in the device chassis 202.

Referring now to FIG. 2B, a conventional air filtering subsystem 206 is illustrated that may be provided for the telecommunications device 200. Such conventional air filtering subsystems typically span across all of the modular fan chassis 204 when those modular fan chassis 204 are housed in the device chassis 202, and must be custom designed for the telecommunication device 200 due to the differences in locations of fan subsystems, power supply units (PSUs), connectors, cabling, and other features across different telecommunications device designs. The need for custom air filtering subsystems is associated with relatively high costs (e.g., sheet metal air filtering systems are typically associated with tooling costs that range up to $50,000 USD) for an air filtering system design that can typically only be used with one device product design. Furthermore, as can be seen in FIG. 2B, the air filtering subsystem 206 is secured to the device chassis 202 via a plurality of screws 206*a*, which requires the entire air filtering subsystem 206 to be removed from the device chassis 202 (i.e., by unfastening all of the screws 206*a*) in order to access the modular fan chassis 204 and/or other elements of the telecommunication device 200. Finally, the air filtering subsystem 206 often obstructs features on the device chassis 202 including the LEDs on the modular fan devices 204, PSUs, cabling, etc.

Accordingly, it would be desirable to provide an improved an improved air filtering system for modular fan chassis.

SUMMARY

According to one embodiment, an information handling system (IHS) includes a system chassis that defines a system chassis housing, that defines a modular fan chassis housing, and that includes modular fan chassis coupling features adjacent the modular fan chassis housing; a processing system that is located in the system chassis; a memory system that is located in the system chassis; a modular fan chassis that is located in the modular fan chassis housing and that includes: a base that defines a fan device housing that is configured to house a fan device; at least one system chassis coupling feature that is that is coupled to the modular fan chassis coupling features; an air inlet that is defined by the base and that is configured to allow air to enter the fan device housing; an air outlet that is defined by the base and that is configured to allow air to exit the fan device housing and enter the system chassis housing; and an air filter housing that is defined by the base, that is located between the air inlet and the air outlet, and that is configured to house an air filter.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
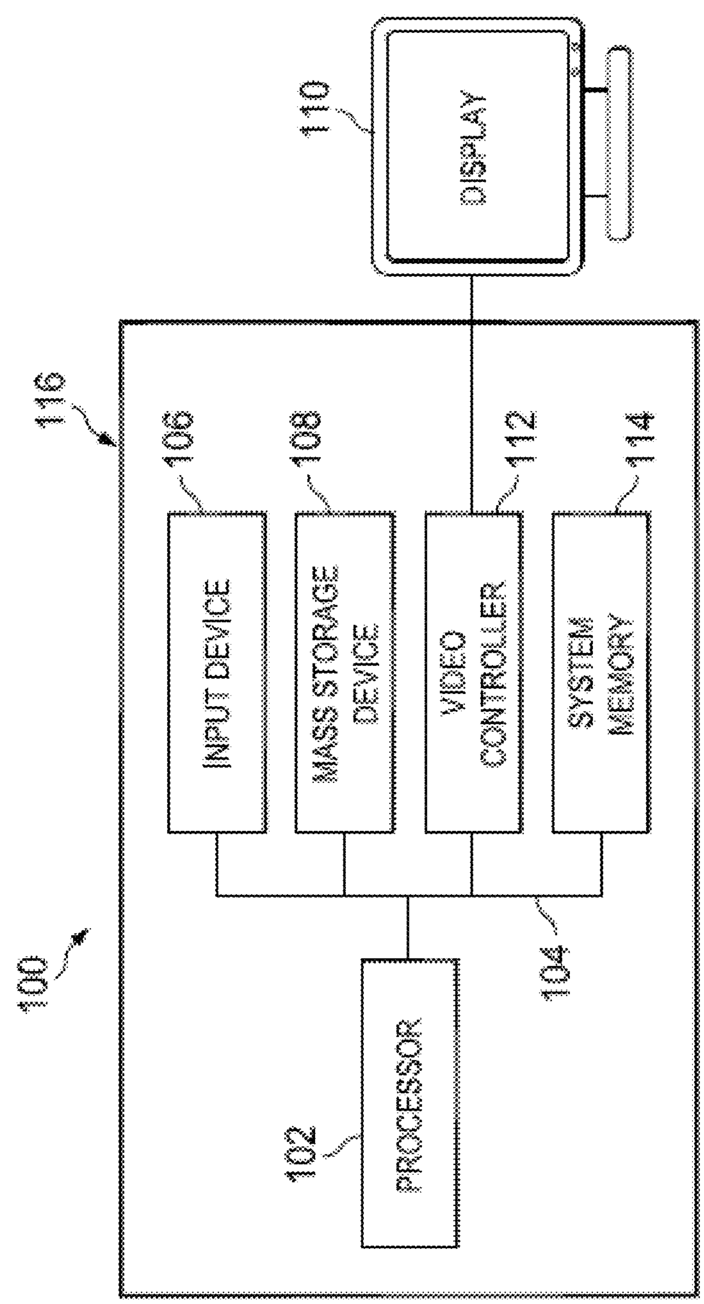
FIG. 1 is a schematic view illustrating an embodiment of an information handling system.
Figure 2A:
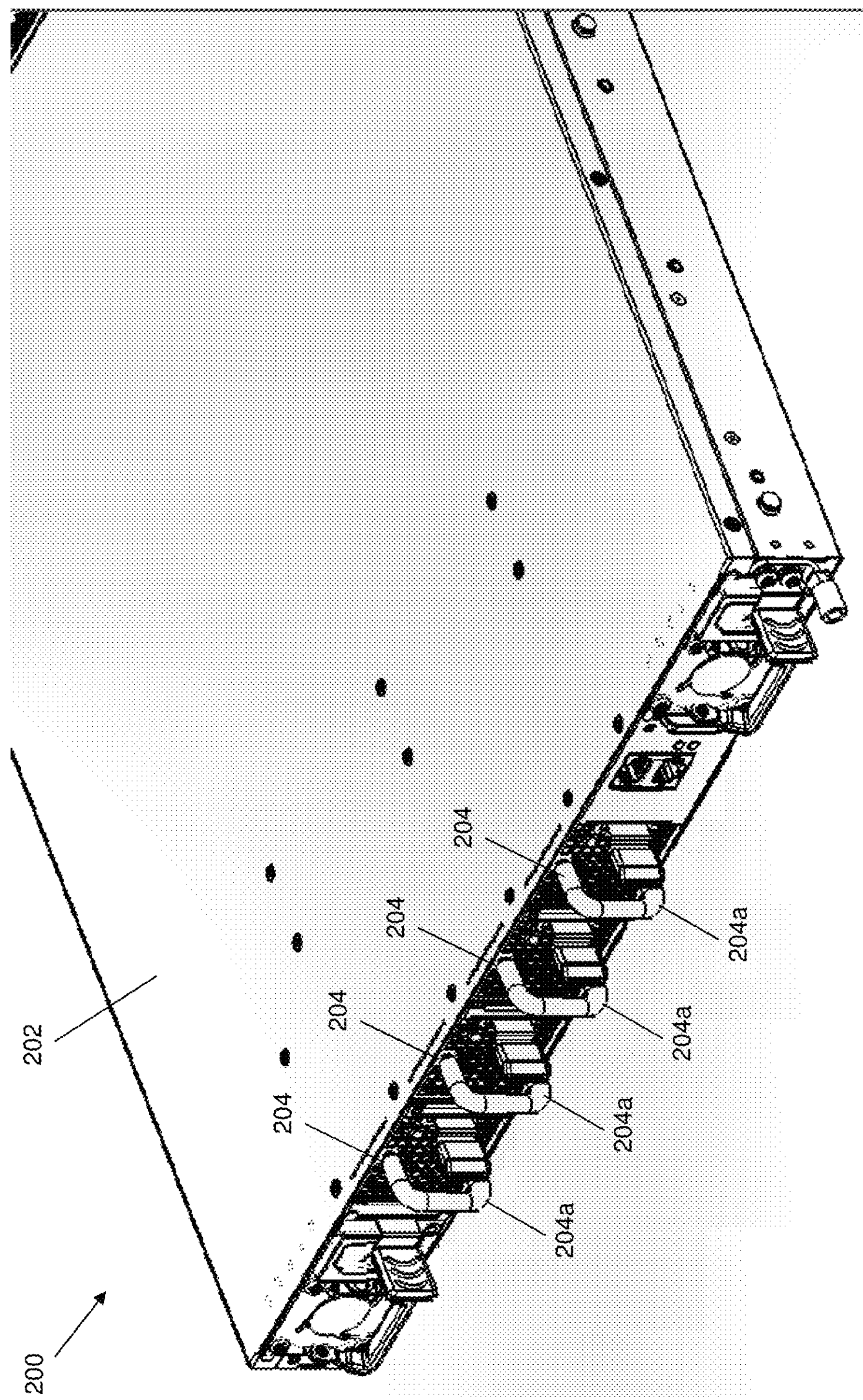
FIG. 2A is a perspective view illustrating an embodiment of a prior art telecommunications device.
Figure 2B:
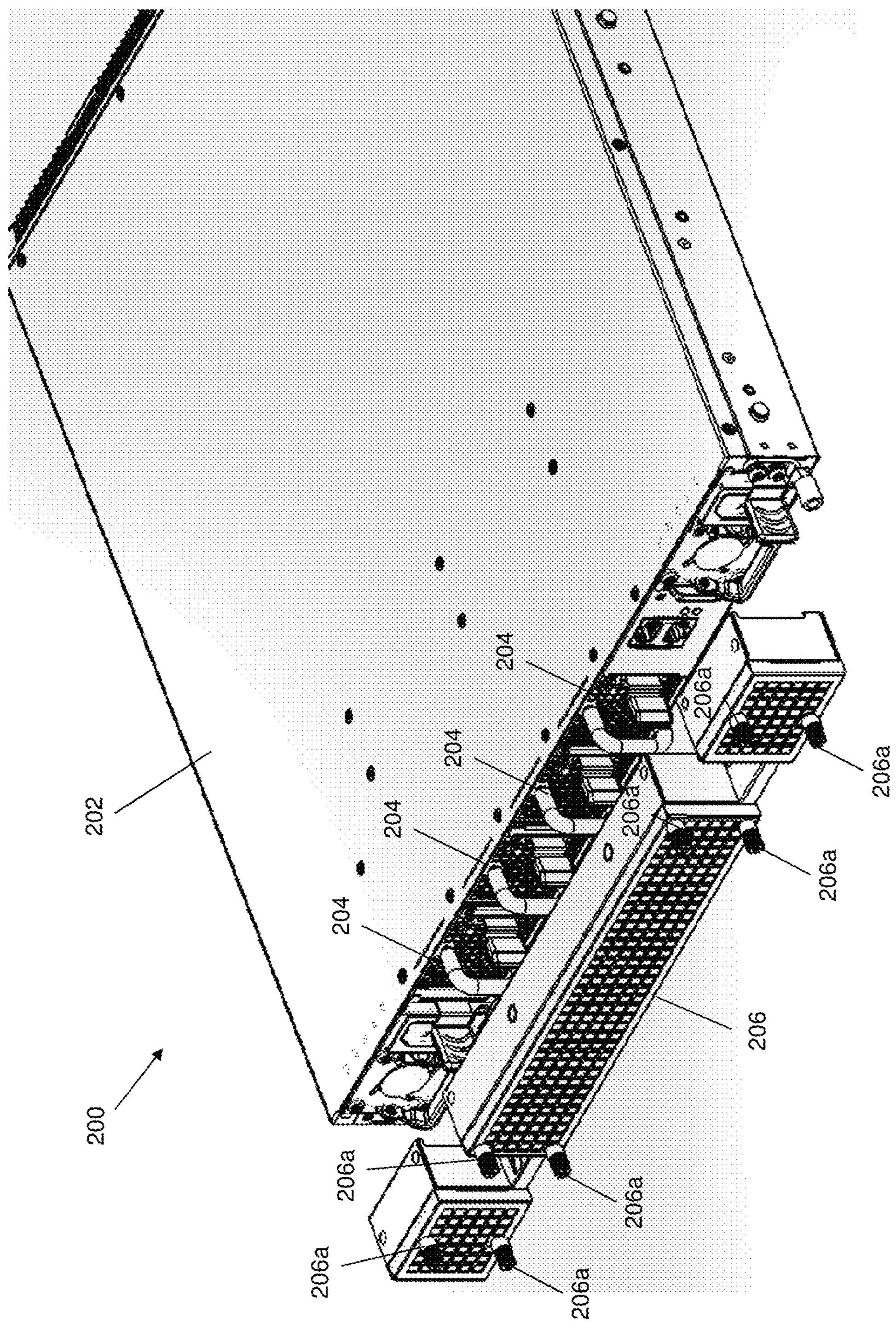
FIG. 2B is a perspective view illustrating an embodiment of a prior art air filtering subsystem used with the prior art telecommunication device of FIG. 2A.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 3A:
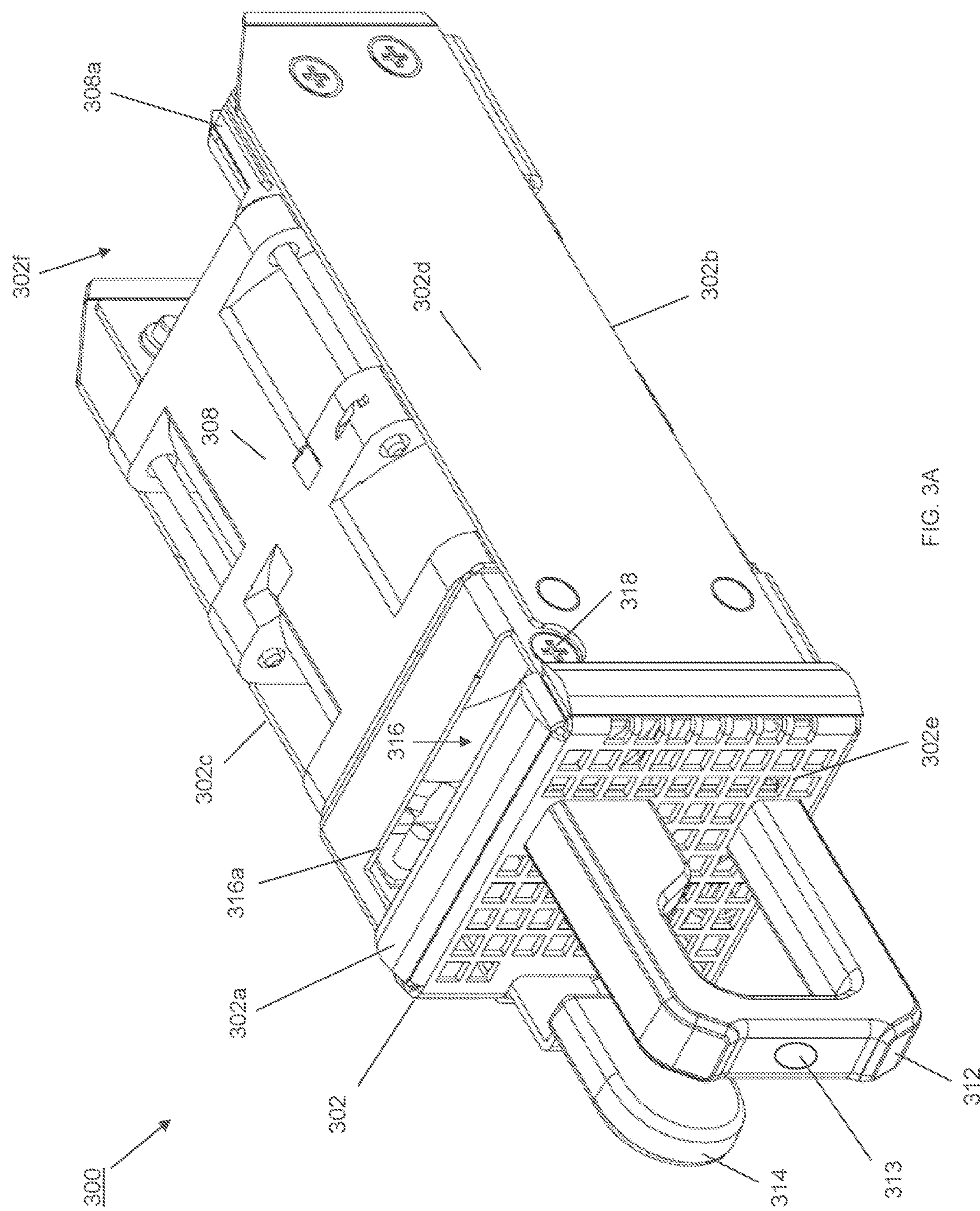
FIG. 3A is a front perspective view illustrating an embodiment of a modular fan chassis housing a fan device.
Figure 3B:
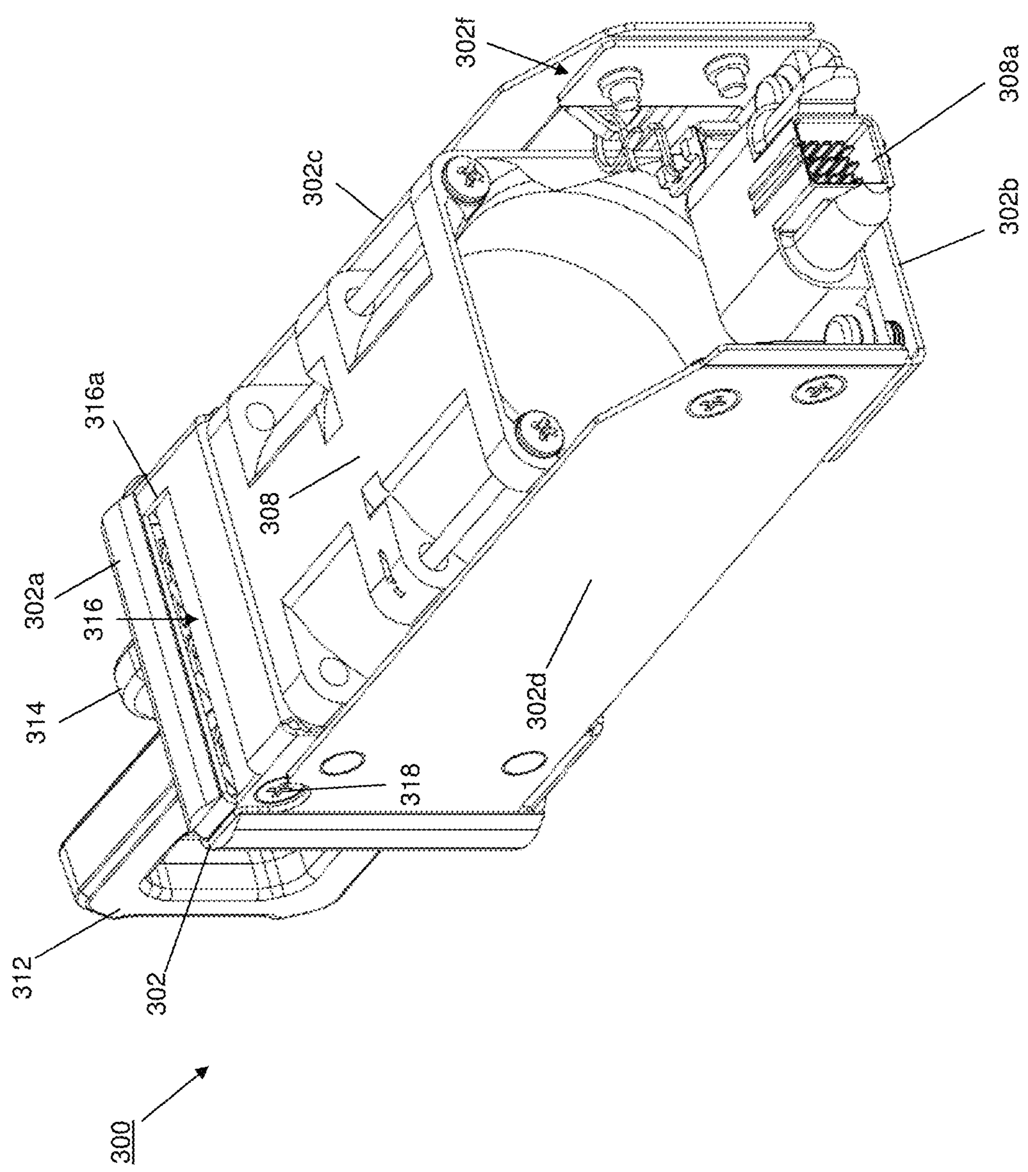
FIG. 3B is a rear perspective view illustrating an embodiment of the modular fan chassis of FIG. 3A housing the fan device.
Figure 3C:
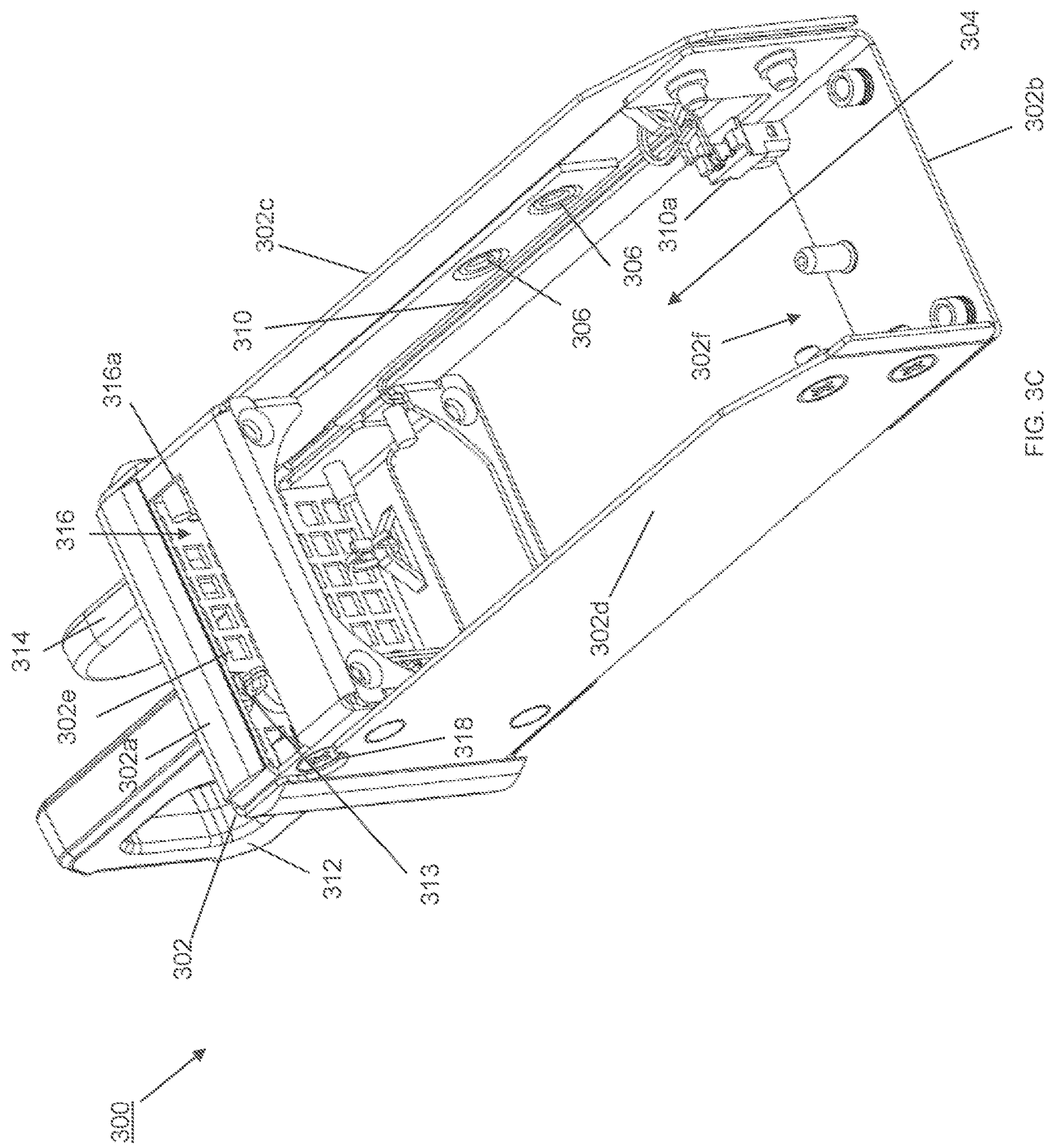
FIG. 3C is a rear perspective view illustrating an embodiment of the modular fan chassis of FIG. 3A without the fan device.

Referring now to FIGS. 3A, 3B, and 3C, an embodiment of a modular fan chassis 300 is illustrated. In the embodiments illustrated and discussed below, the modular fan chassis 300 is described as housing only a fan device. However, one of skill in the art in possession of the present disclosure will recognize that the module fan chassis 300 may house additional components such as, for example, power supply units (PSUs), processing systems, memory systems, storage systems, and/or other information handling system components known in the art. In the illustrated embodiment, the modular fan chassis 300 includes a base 302 having a front wall 302*a*, a bottom wall 302*b* extending from the front wall 302*a*, and a pair of side walls 302*c* and 302*d* that are spaced apart from each other and that each extend from the front wall 302*a* and the bottom wall 302*b*. In a specific example, the base 302 is dimensioned to have a 1 Rack Unit (1RU) height or otherwise couple to a 1RU height system chassis, although other dimensioned system chassis and modular fan chassis may benefit from the teachings of the present disclosure as well. As illustrated in FIG. 3C, the front wall 302*a*, the bottom wall 302*b*, and the side walls 302*c* and 302*d* define a fan device housing 304 between them. However, one of skill in the art in possession of the present disclosure will recognize that the base 302 may include other walls and/or features that define a fan device housing while remaining within the scope of the present disclosure. In an embodiment, the base 302 (e.g., any or all of the front wall 302*a*, the bottom wall 302*b*, and the sides walls 302*c* and 302*d*) may include system chassis coupling features that are configured to couple to a system chassis, discussed in further detail below.

The front wall 302*a* defines an air inlet 302*e* that is provided, in the illustrated embodiment, by a plurality of apertures that extend through the front wall to the fan device housing 304. An air outlet 302*f* is defined between the edges of the bottom wall 302*b* and the side walls 302*c* and 302*d* that are opposite the base 302 from the front wall 302*a*. In an embodiment, the base 302 (e.g., any or all of the front wall 302*a*, the bottom wall 302*b*, the side walls 302*c* and 302*c*, and/or other portions of the modular fan chassis 300) may include fan device features 306 that are illustrated in FIG. 3C as fastener apertures but that may include slots, clips, channels, and/or any other coupling subsystem known in the art. Using the fan device coupling features 306, a user may couple a fan device 308 to the modular fan chassis 302 during the method 500 discussed below by positioning the fan device 308 adjacent the fan device housing 304, moving the fan device 308 into the fan device housing 304, and using the fan device coupling features 306 to secure the fan device 308 in the fan device housing 304. While not illustrated, as discussed above other devices may be coupled to the modular fan chassis 300 in a similar manner. For example, using other device coupling features similar to the fan device coupling features 306, a user may couple a device (e.g., PSUs, processing systems, memory systems, storage systems, and/or other information handling system components known in the art) to the modular fan chassis 302 during the method 500 discussed below by positioning that device adjacent a device housing (defined by the base and located adjacent the fan device housing 304), moving that into the device housing, and using the other device coupling features to secure that device in the device housing. While only a single fan device 308 is illustrated as located in the fan device housing 304, the modular fan chassis 300 may be configured to couple to multiple fan devices while remaining within the scope of the present disclosure.

In the illustrated embodiment, the fan device 308 includes a system connector 308*a* that is configured to couple to a fan device connector in a system chassis, discussed in further detail below. With reference to FIG. 3A and FIG. 3C, the modular fan chassis 300 may include a status indicator coupling 310 (illustrated as wiring) that extends through the fan device housing 304 and between a light emitting device (LED) connector 310*a* and an LED 313 that is provided on a surface of the front wall 302*a* that is opposite the front wall 302*a* from the fan device housing 304, discussed in further detail below. In an embodiment, when the fan device 308 is coupled to the modular fan chassis 300, the LED connector 310*a* may engage the system connector 308*a* on the fan device 308 such that it may receive status indications through the system connector 308*a* and transmit those status indications via the status indicator coupling 310 to the LED 313, discussed in further detail below.

A handle 312 extends from a surface of the front wall 302*a* that is opposite the front wall 302*a* from the fan device housing 304, and a securing member 314 extends from that surface of the front wall 302*a* adjacent the handle 312. As discussed below, the handle 312 may be utilized to position the modular fan chassis 300 in a system chassis, while the securing member 314 may be configured to both secure the modular fan chassis 300 in the system chassis and provide for the release of securing features to remove the modular fan chassis 300 from the system chassis (e.g., using the handle 312). In the embodiments illustrated and discussed below, the handle 312 provides or includes the LED 313 that is configured to illuminate in response to status indications received by the LED connector 310*a* through the system connector 308*a* on the fan device 308 and transmitted via the status indicator coupling 310. For example, the handle may include the LED 313 that illuminates in response to status indications, and/or may be coupled to LED 313 via an optical cable that is configured to transmit light, and may be fabricated from an optical material that allows the transmission of light such that light emitted by the LED 313 is transmitted through the optical cable and the material in the handle 312 to illuminate the handle 312. However, in other embodiments, the handle 312 may not be configured to illuminate, and a separate LED may be provided on the surface of the front wall 302*a* that is opposite the front wall 302*a* from the fan device housing 304.

The base 302 also defines an air filter housing 316 having an air filter entrance 316*a*. In the illustrated embodiment, the air filter housing 316 is illustrated as located immediately adjacent the front wall 302*a*/air inlet 302*e* and between the front wall 302*a*/air inlet 302*e* and the fan device housing 304/fan device 308. However, in other embodiments, the air filter housing 316 may located immediately adjacent the air outlet 302*f* and between the air outlet 302*f* and the fan device housing 304/fan device 308, between two fan device housings defined by the base 302, immediately adjacent the bottom wall 302*b* or either of the side walls 302*c* and 302*d* (e.g., with a fan device positioned to draw air through those walls), and/or in a variety of other locations that one of skill in the art in possession of the present disclosure would recognize would fall within the scope of the present disclosure. In different embodiments, the base 302 may include different features for coupling to an air filter in the air filter housing 316, including the fastener 318 in the illustrated example, as well as tool-less solutions such as channels, clips, gates, and/or other tool less fastening subsystems known in the art. While a specific modular fan chassis 200 has been illustrated, one of skill in the art in possession of the present disclosure will recognize that a wide variety of modification to the modular fan chassis 200 will fall within the scope of the present disclosure.

Figure 4:
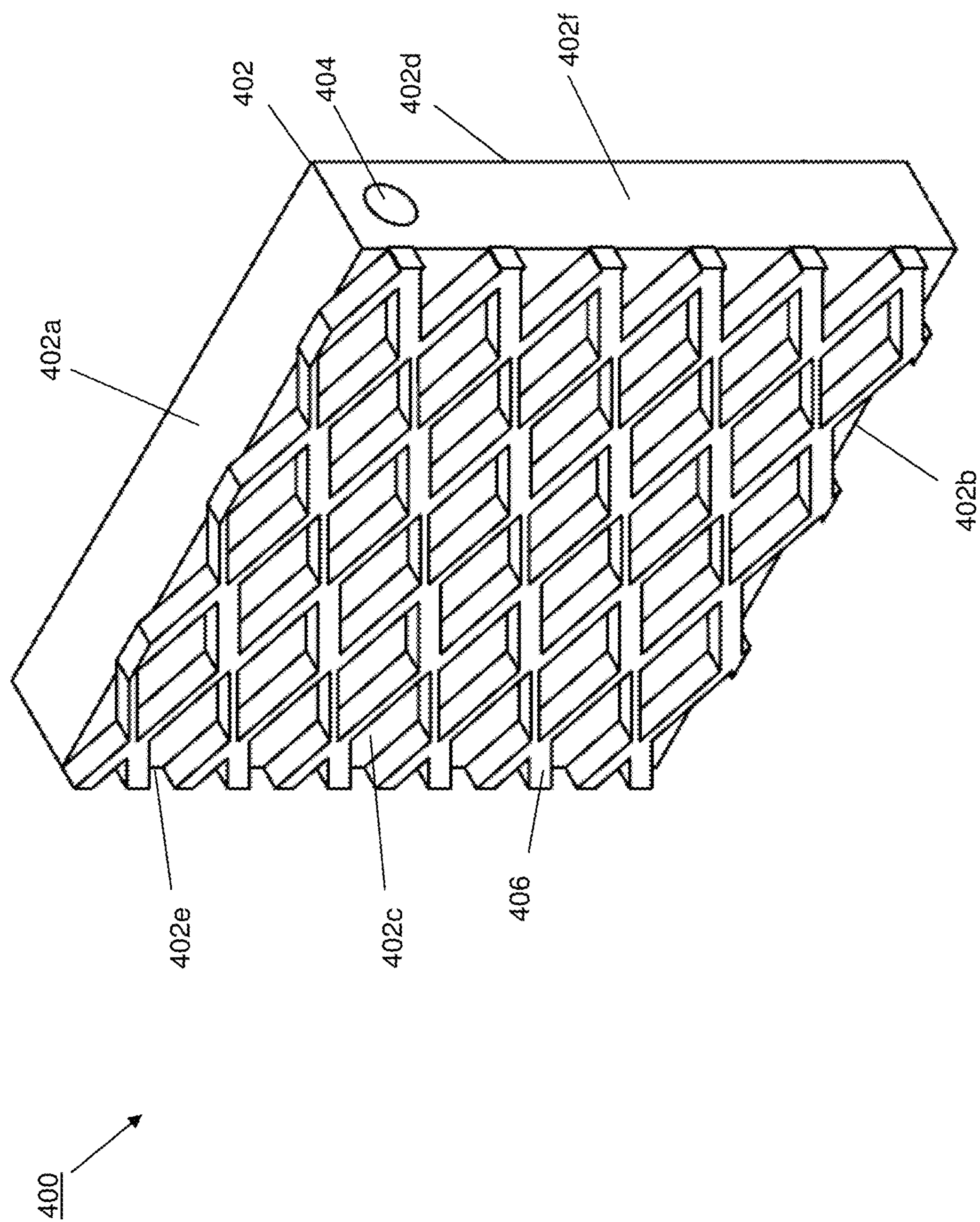
FIG. 4 is a perspective view illustrating an embodiment of an air filter used with the modular fan chassis of FIGS. 3A-3C.

Referring now to FIG. 4, an embodiment of an air filter 400 is illustrated. The air filter 400 includes a base 402 having a top surface 402*a*, a bottom surface 402*b* that is located opposite the base 402 from the top surface 402, a front surface 402*c* that extends between the top surface 402*a* and the bottom surface 402*b*, a rear surface 402*d* that is located opposite the base 402 from the front surface 402*c* and extends between the top surface 402*a* and the bottom surface 402*b*, and a pair of opposing side surfaces 402*e* and 402*f* that are located opposite the base 402 from each other and extend between the top surface 402*a*, the bottom surface 402*b*, the front surface 402*c*, and the rear surface 402*d*. In a specific example, the base 402 is dimensioned to have a 1 Rack Unit (1 RU) height or otherwise couple to a 1 RU height modular fan chassis that is used in a 1 RU system chassis, although other dimensioned system chassis, modular fan chassis, and air filters may benefit from the teachings of the present disclosure as well. In different embodiments, the base 420 may include fibrous materials that remove solid particulates such as dust, pollen, mold, and bacteria; absorbent or catalyst chemicals that remove airborne molecular contaminants such as volatile organic compounds or ozone, and/or a variety of other air filter materials known in the art. In the illustrated embodiment, the base 402 defines a securing aperture 404 that is configured to engage a fastener, but as discussed above in some embodiments, the securing aperture 404 may be omitted (e.g., when tool less air filter coupling features are provided in the modular fan chassis 300). In the illustrated embodiment, the air filter 400 also includes a grate 406 that defines a plurality of air passageways that extend through the grate 406 to the base 402. While a specific air filter 400 has been illustrated, one of skill in the art in possession of the present disclosure will recognize that a wide variety of modification to the air filter 400 will fall within the scope of the present disclosure.

Figure 5:
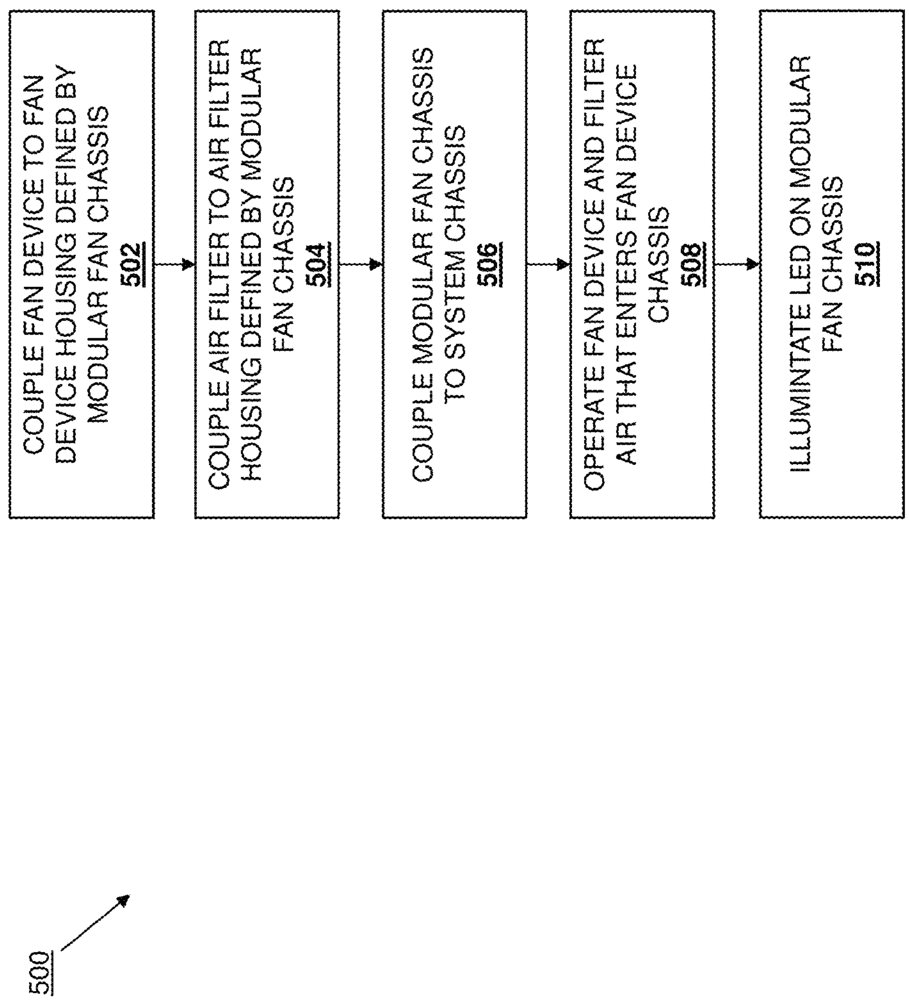
FIG. 5 is a flow chart illustrating an embodiment of a method for providing air filtering for a modular fan chassis.

Referring now to FIG. 5, an embodiment of a method 500 for providing air filtering for a modular fan chassis is illustrated. As discussed below, the systems and methods of the present disclosure provide for air filtering in a modular fan chassis that utilizes respective air filters that may be housed in each modular fan chassis, which eliminates the need for the customization of air filters for different system chassis designs, reduces costs by providing for air filtering across different product designs, allows for the air filter in any modular fan chassis to be easily replaced, provides for quick and easy access to components in the modular fan chassis and/or elements in the system chassis, and doesn't obstruct features on the system chassis.

The method 500 begins at block 502 where a fan device is coupled to a fan device housing defined by a modular fan chassis. As discussed above, at block 502 a user may couple the fan device 308 to the modular fan chassis 302 by positioning the fan device 308 adjacent the fan device housing 304, moving the fan device 308 into the fan device housing 304, and using the fan device coupling features 306 to secure the fan device 308 in the fan device housing 304. Furthermore, while not illustrated, other devices may be coupled to the modular fan chassis 300 in a similar manner. For example, using other device coupling features similar to the fan device coupling features 306, at block 402 the user may couple a device (e.g., PSUs, processing systems, memory systems, storage systems, and/or other information handling system components known in the art) to the modular fan chassis 302 by positioning that device adjacent a device housing (defined by the base and located adjacent the fan device housing 304), moving that into the device housing, and using the other device coupling features to secure that device in the device housing.

Figure 6:
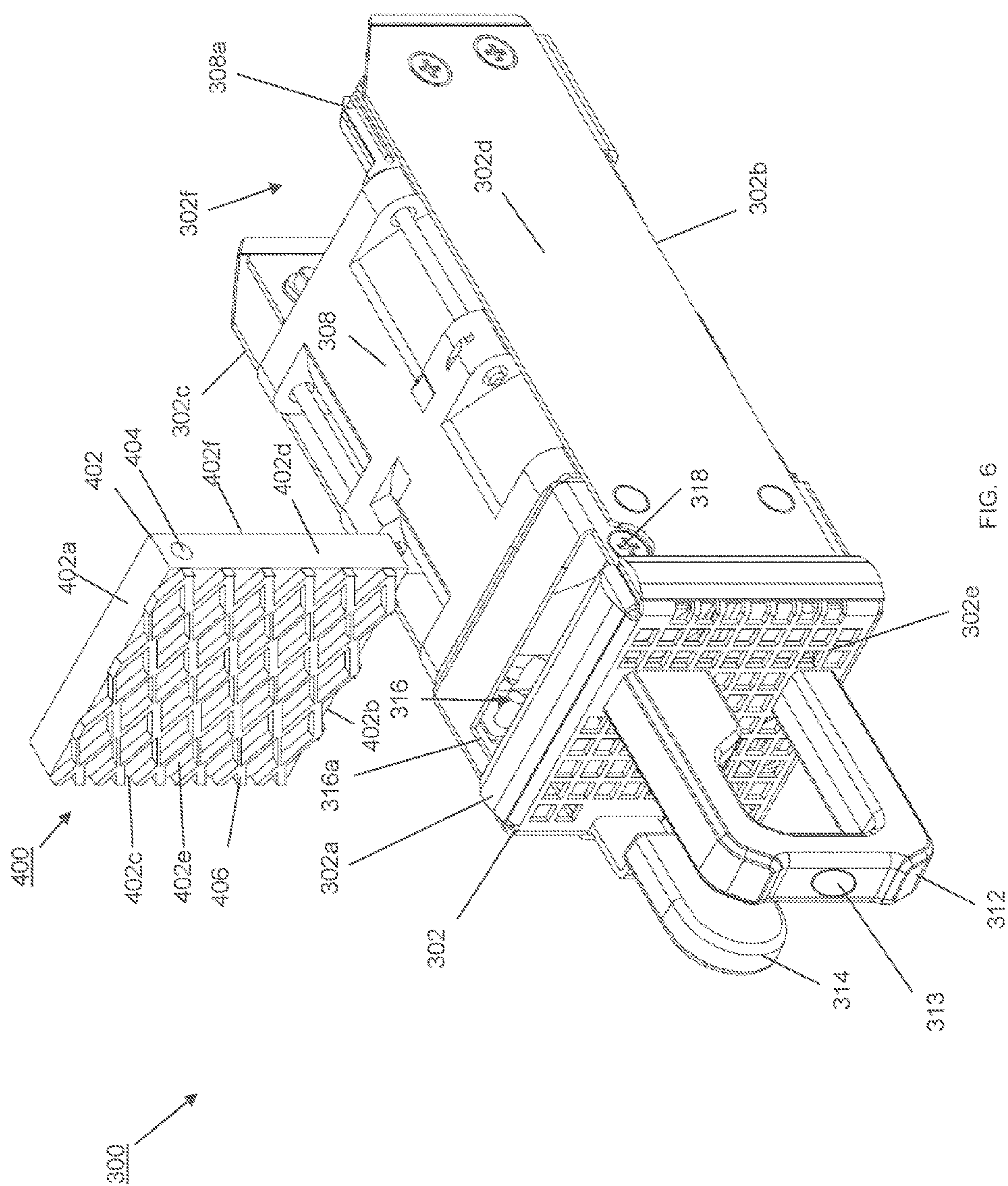
FIG. 6 is a perspective view illustrating an embodiment of the air filter of FIG. 4 being provided in the modular fan chassis of FIGS. 3A-3C.

The method 500 then proceeds to block 504 where an air filter is coupled to an air filter housing defined by the modular fan chassis. Referring now to FIG. 6, at block 504 a user may couple the air filter 400 to the modular fan chassis 302 by positioning the air filter 400 adjacent the fan device housing 304 such that the bottom surface 402*b* of the air filter 400 is immediately adjacent the air filter entrance 316*a* of the air filter housing 316, moving the air filter 400 through the air filter entrance 316*a* and into the air filter housing 316, and in some embodiments, securing the air filter 400 to the modular fan chassis 300. For example, the user may engage the fastener 318 with the securing aperture 404 on the air filter 400 in order to secure the air filter 400 in the modular fan chassis 300. However, in other embodiments, the coupling/securing of the air filter 400 to the modular fan chassis 300 is tool less and the fastener 318 and securing aperture 404 may be omitted. For example, the air filter 400 may engage channels, clips, gates, and/or other tool less fastening subsystems, as well as utilize gravity, when it is located in the air filter housing 316 in order to secure the air filter 400 to the modular fan chassis 300.

Figure 7:
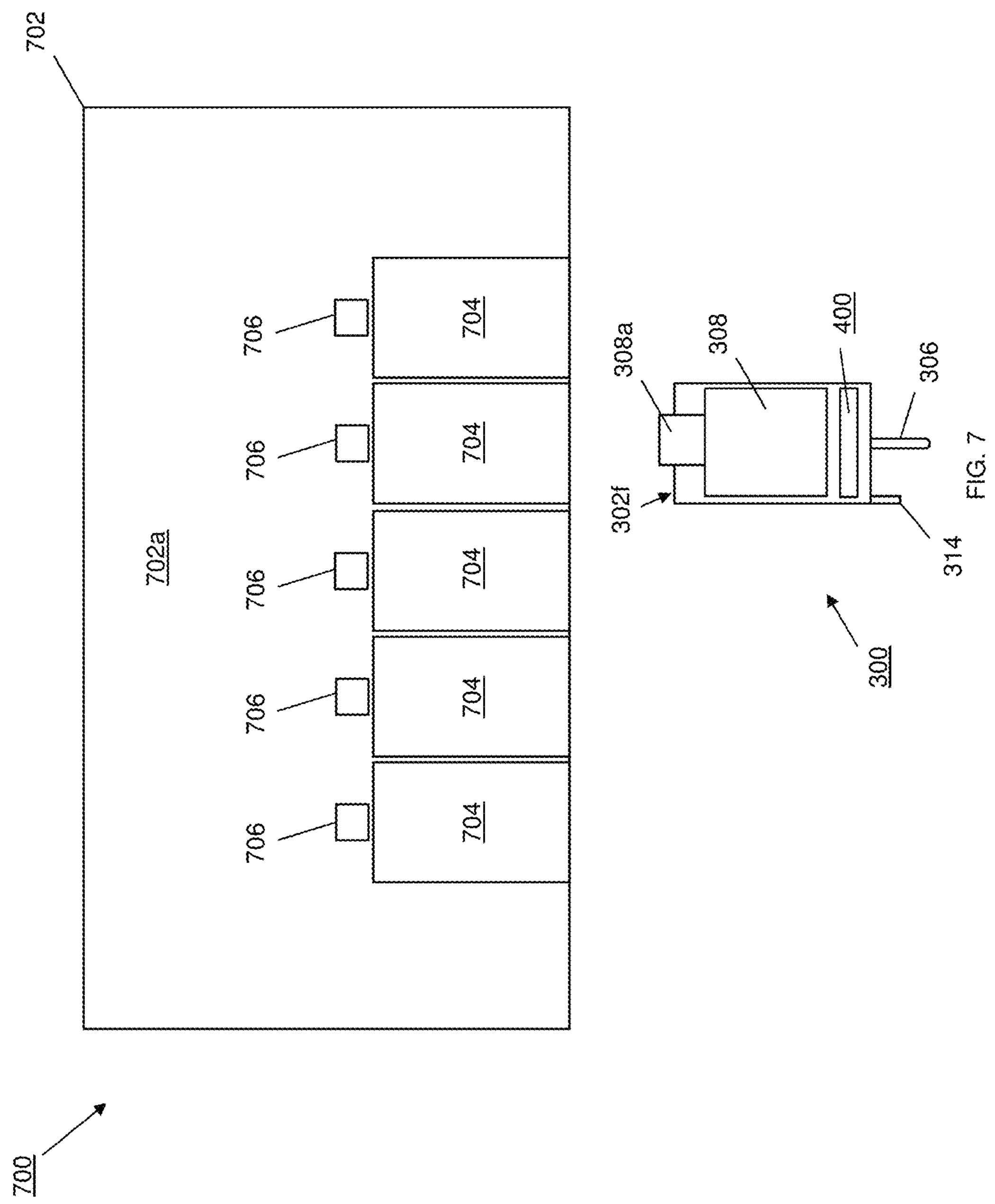
FIG. 7 is a top view illustrating the modular fan chassis and air filter of FIG. 6 being positioned in a system chassis.
Figure 8:
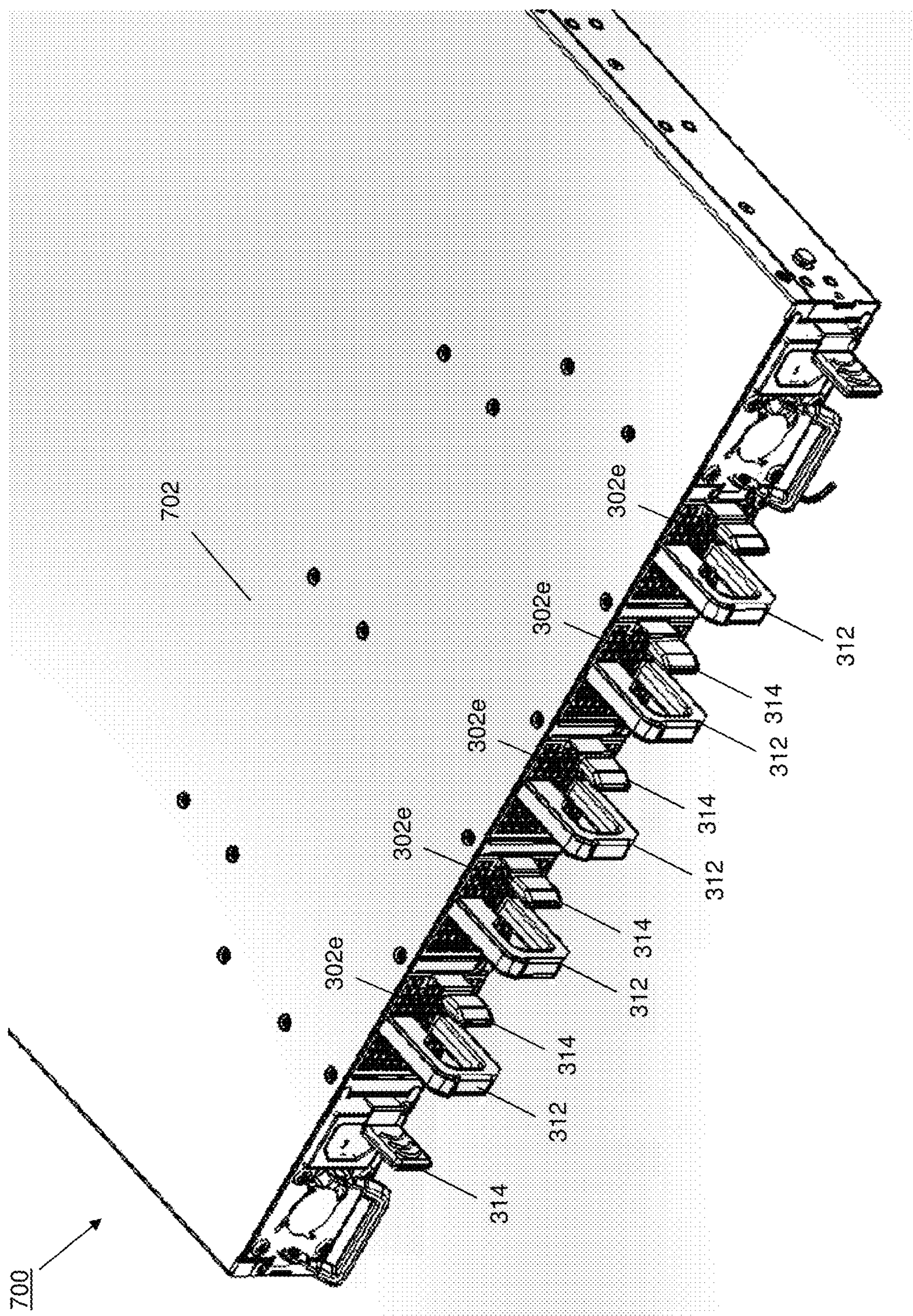
FIG. 8 is a perspective view illustrating a plurality of the modular fan chassis and air filter of FIG. 6 positioned in a system chassis.
Figure 9:
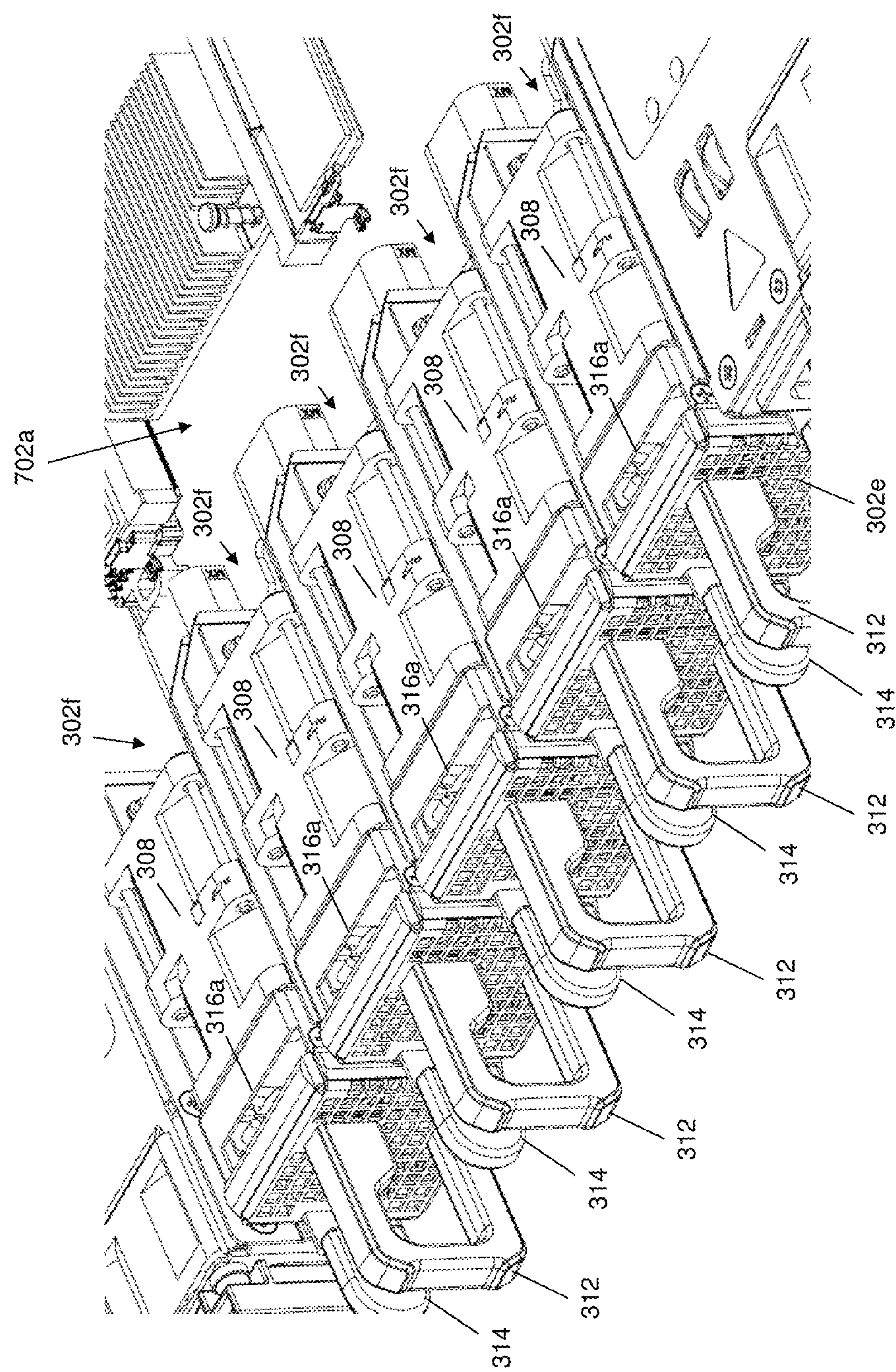
FIG. 9 is a perspective view illustrating a plurality of the modular fan chassis and air filter of FIG. 6 positioned in a system chassis.

In a specific embodiment, the modular fan chassis 300 may include a spring-loaded subsystem that is located adjacent the air filter housing 316 and that is engaged by the air filter 400 as the air filter 400 is positioned in the air filter housing 316 and overcomes a spring force via that engagement to move the spring-loaded subsystem and secure it into a first orientation that allows the air filter 400 to be completely positioned in the air filter housing 316. That spring-loaded subsystem may then be activated into a second orientation by a force applied to the air filter 400 that un-secures the spring-loaded subsystem and causes the spring loaded subsystem to push the air filter 400 at least partially through the air filter entrance 316*a* and out of the air filter housing 316 so that the user may grasp the air filter 400*a* and remove it from the modular fan chassis 300 (i.e., to replace the air filter 400). As discussed above, while single air filter 400 is illustrated as being positioned immediately adjacent the front wall 302*a*/air inlet 302*e* and between the front wall 302*a*/air inlet 302*e* and the fan device housing 304/fan device 308, in other embodiments one or more of the air filter 400 may be positioned immediately adjacent the air outlet 302*f* and between the air outlet 302*f* and the fan device housing 304/fan device 308, between two fan device housings/fan devices 308 coupled to the modular device chassis 300, immediately adjacent the bottom wall 302*b* or either of the side walls 302*c* and 302*d* (e.g., with a fan device positioned to draw air through those walls), and/or in a variety of other locations that one of skill in the art in possession of the present disclosure would recognize would fall within the scope of the present disclosure The method 500 then proceeds to block 506 where the modular fan chassis is coupled to a system chassis. Referring now to FIGS. 7, 8, and 9, a system chassis 700 is illustrated that may be the IHS 100 discussed above with reference to FIG. 1, and/or may include some or all of the IHS components discussed above with reference to FIG. 1. For example, the system chassis 700 may provide the telecommunications device 200 discussed above (e.g., a telecommunications switch) that includes a 1 rack unit (1RU) height and that is required by a telecommunicates provider to satisfy NEBS Level 3 certifications by including air filtering subsystems for its fan systems. However, the teachings of the present disclosure may be beneficial for other devices and systems chassis, and thus those devices and systems chassis are envisioned as falling within the scope of the present disclosure. The system chassis 700 defines a system chassis housing 702*a* that houses the components of the system such as, for example, telecommunications components and/or other components known in the art. Furthermore, the system chassis 700 also defines a plurality of a modular fan chassis housings 704 and includes a respective fan device connector 706 located adjacent each modular fan chassis housing 704. While not illustrated, the system chassis 702 may include modular fan chassis coupling features that are located adjacent the modular fan chassis housings 704 and that are configured to engage the system chassis coupling features on the modular fan chassis 300 to couple and/or secure the modular fan chassis 300 to the system chassis 700.

As illustrated in FIG. 7, at block 506, the user may position the modular fan chassis 300 including the fan device 308 and the air filter 400 adjacent a modular fan chassis housing 702 such that the air outlet 302*f* is located adjacent an entrance of that modular fan chassis housing 704. The user may then move the modular fan chassis 300 into the modular fan chassis housing 704 such that the modular fan chassis coupling features on the system chassis 700 that are located adjacent that modular fan chassis housing 704 engage the system chassis coupling features on the modular fan chassis 300 to couple and/or secure the modular fan chassis 300 to the system chassis 700, as illustrated in FIGS. 8 and 9. Positioning of the modular fan chassis 300 in the modular fan chassis housing 704 causes the system connector 308*a* coupled to the fan device 308 to engage the fan device connector 706 adjacent that modular fan chassis housing 704. As also illustrated in FIGS. 8 and 9, the user may couple a plurality of modular fan chassis 300 (including respective fan devices 308 and air filters 400) to the system chassis 700 in a similar manner via each of the modular fan chassis housings 704.

The method 500 then proceeds to block 508 where the fan device is operated and air that enters the fan device chassis is filtered. In an embodiment, at block 508, any fan device 308 coupled to a modular fan chassis 300 that has been coupled to the system chassis 700 may receive power and instructions (e.g., from a processing system in the system chassis 700 and via the connection of its system connector 308*a* to a respective fan device connector 706) that cause that fan device 308 to operate. Operation of any fan device 308 coupled to a modular fan chassis 300 that has been coupled to the system chassis 700 causes air to be drawn into the fan device housing 304 through the air inlet 302*e*, through the fan device housing 304 and the fan device 308, and expelled out of the fan device housing 304 and the fan device 308 through the air outlet 302*f* and into the system chassis housing 702*a*. As that air is drawn through the modular fan chassis 300, it is filtered by the air filter 400 to remove solid particulates such as dust, pollen, mold, and bacteria; airborne molecular contaminants such as volatile organic compounds or ozone; and/or a variety of other filtered materials known in the art.

Similarly as discussed above, while a single air filter 400 is illustrated as filtering air immediately following that air entering the modular fan chassis 300 through the air inlet 302*a* via operation of the fan device 308, in other embodiments one or more of the air filter 400 may filter air immediately before that air exits the modular fan chassis 300 through the air outlet 302*f* via operation of the fan device 308, between two operating fan devices 308, immediately adjacent the bottom wall 302*b* or either of the side walls 302*c* and 302*d* (e.g., with a fan device positioned to draw air through those walls), and/or in a variety of other manners that one of skill in the art in possession of the present disclosure would recognize would fall within the scope of the present disclosure. Furthermore, the modular fan chassis 300 allows the air filters 400 to be easily removed (particular when those air filters are tool-lessly coupled to the modular fan chassis 300, but also when a single fastener is used to secure the air filter 400 the modular fan chassis 300 as illustrated), or not included in the modular fan chassis 300 to provide for reduced air filter costs when the system chassis is not required to be satisfy NEBS Level 3 certifications.

The method 500 then proceeds to block 510 where an LED on the modular fan chassis is illuminated. In an embodiment, at block 510 status indications may be provided from the fan device 308 and/or through the fan device connector 706 (e.g., from a processing system located in the system chassis 700) to the system connector 308*a*. Those status indications transmitted from the LED connector 310*a* and through the status indicator coupling 310 that extends through the fan device housing 304 to the LED 313 on the front wall 302*a* to cause the LED 313 to illuminate based on those status indications. As discussed above, in a specific example the LED 313 may be provided by (or with) the handle 312 such that the handle 312 illuminates based on status indications received from the fan device 308 and/or through the fan device connector 706 from a processing system in the system chassis 700. As would be appreciated by one of skill in the art in possession of the present disclosure, the integration of the air filter 400 and air filter housing 316 into the modular fan chassis 300 and behind the front wall 302*a* that includes the LED 313 prevents the air filtering subsystem from obstructing a user's view of the illumination of the LED 313, as occurs in conventional modular fan chassis air filtering systems.

Thus, systems and methods have been described that provide for air filtering in a modular fan chassis via respective air filters that are housed in each modular fan chassis rather than provided in a separate air filtering chassis that is coupled to the front of a system chassis that includes the modular fan chassis. Such integration of the air filter and air filter housing with the modular fan chassis eliminating the need to manufacture customized air filtering chassis and subsystems for different system chassis designs, which reduces costs by providing modular fan chassis with air filtering that may be utilized across different product designs, allows for the air filter in any modular fan chassis to be easily replaced, provides for quick and easy access to components in the modular fan chassis and/or elements in the system chassis, and doesn't obstruct LEDs or cabling provided on a surface of the system chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A modular fan chassis air filtering system, comprising:

a base that defines a fan device housing that is configured to house a fan device, wherein the base includes a front wall, a bottom wall that extends from the front wall, a first side wall that extends from the front wall, and a second side wall that is spaced apart from the second side wall and that extends from the front wall;

an air inlet that is defined by a plurality of apertures that extend through the front wall of the base and that is configured to allow air to enter the fan device housing;

an air outlet that is defined by the base and that is configured to allow air to exit the fan device housing;

an air filter housing that is defined by the base, that is located immediately adjacent the air inlet and between the air inlet and the air outlet, and that is configured to house an air filter, wherein the air filter housing includes an air filter entrance that is defined by the front wall, the bottom wall, the first side wall, and the second side wall, and wherein the air filter entrance is configured to receive the air filter for the air filter housing when the base is assembled and the fan device is housed in the fan device housing;

an air filter located in the air filter housing;

a handle that is located on the base immediately adjacent the air inlet and that extends from a surface of the front wall;

a light emitting device (LED) that is located in the handle: and a status indicator coupling extending between the LED and an LED connector wherein the LED connector is configured to couple with a system connector on the fan device, and wherein the LED is configured to receive status indications from either the fan device or a processing system located in the system chassis through the status indicator coupling and, in response, illuminate the handle based on the status indications when the system connector on the fan device is coupled to the LED connector and a fan device connector that is located in the system chassis; and a fan device that is located in the fan device housing and that is coupled to the LED connector via the system connector that is configured to couple to the fan device connector that is located in the system chassis;

wherein the plurality of apertures are disposed on each lateral side of the handle on the front wall.

2. The system of claim 1, wherein in the air filter housing is configured to house the air filter having a height of substantially one rack unit.

3. An information handling system (IHS), comprising:

a system chassis that defines a system chassis housing and that defines a modular fan chassis housing;

a processing system that is located in the system chassis;

a memory system that is located in the system chassis;

a modular fan chassis that is located in the modular fan chassis housing and that includes:

a base that defines a fan device housing that is configured to house a fan device, wherein the base includes a front wall, a bottom wall that extends from the front wall, a first side wall that extends from the front wall, and a second side wall that is spaced apart from first side wall and that extends from the front wall;

an air inlet that is defined by a plurality of apertures that extend through the front wall of the base and that is configured to allow air to enter the fan device housing;

an air outlet that is defined by the base and that is configured to allow air to exit the fan device housing and enter the system chassis housing;

an air filter housing that is defined by the base, that is located immediately adjacent the air inlet and between the air inlet and the air outlet, and that is configured to house an air filter, wherein the air filter housing includes an air filter entrance that is defined by the front wall, the bottom wall, the first side wall, and the second side wall, and wherein the air filter entrance is configured to receive the air filter for the air filter housing when the base is assembled and the fan device is housed in the fan device housing;

an air filter located in the air filter housing;

a handle that is located on the base immediately adjacent the air inlet and that extends from a surface of the front wall;

a light emitting device (LED) that is located in the handle; and a status indicator coupling extending between the LED and an LED connector wherein the LED connector is configured to couple with a system connector on the fan device, and wherein the LED is configured to receive status indications from either the fan device or the processing system through the status indicator coupling and illuminate the handle based on the status indications when the system connector on the fan device is coupled to the LED connector and a fan device connector that is located in the system chassis; and a fan device that is located in the fan device housing and that is coupled to the LED connector via the system connector that is configured to couple to the fan device connector that is located in the system chassis;

wherein the plurality of apertures are disposed on each lateral side of the handle on the front wall.

4. The IHS of claim 3, wherein in the air filter housing is configured to house the air filter having a height of substantially one rack unit.

5. A method for providing air filtering for a modular fan chassis comprising:

positioning a fan device in a fan device housing that is defined by a modular fan chassis that includes a front wall, a bottom wall that extends from the front wall, a first side wall that extends from the front wall, and a second side wall that is spaced apart from the first side wall and that extends from the front wall;

coupling, to a system connector on the fan device, a Light Emitting Device (LED) connector that is coupled to a status indicator coupling extending between an LED that is visible on the front wall and the LED connector;

positioning an air filter via an air filter entrance and into an air filter housing that is defined by the modular fan chassis and that is located immediately adjacent the air inlet and adjacent the fan device housing, wherein the air filter entrance is defined by the front wall, the bottom wall, the first side wall, and the second side wall, and wherein the modular fan chassis is assembled and the fan device is housed in the fan device housing;

positioning, subsequent to the positioning the air filter via the air filter entrance and into the air filter housing, the modular fan chassis in a modular fan chassis housing defined by a system chassis, the positioning the modular fan chassis in the modular fan chassis housing defined by the system chassis includes using a handle that extends from a surface of the front wall and that is located immediately adjacent the air inlet wherein the plurality of apertures are disposed on each lateral side of the handle on the front wall;

coupling the system connector to a fan device connector that is located in the system chassis and that is coupled to a processing system located in the system chassis;

operating the fan device to cause air to enter the fan device housing through an air inlet that is defined by a plurality of apertures that extend through the front wall of the modular fan chassis;

filtering the air that enters the fan device housing through the air inlet using the air filter; and illuminating the LED based on a status indication received by the LED from either the fan device or the processing system via the system connector, the LED connector, and the status indicator coupling, wherein the LED that is visible on the front wall is located in the handle and the illumination of the LED based on the status indication illuminates the handle.

6. The method of claim 5, wherein the air filter housing is configured to house the air filter having a height of substantially one rack unit.

* * * * *